(12) United States Patent
Harari et al.

(10) Patent No.: US 6,894,343 B2
(45) Date of Patent: May 17, 2005

(54) FLOATING GATE MEMORY CELLS UTILIZING SUBSTRATE TRENCHES TO SCALE DOWN THEIR SIZE

(75) Inventors: Eliyahou Harari, Los Gatos, CA (US); Jack H. Yuan, Cupertino, CA (US); George Samachisa, San Jose, CA (US)

(73) Assignee: SanDisk Corporation, Sunnyvale, CA (US)

( * ) Notice: Subject to any disclaimer, the term of this patent is extended or adjusted under 35 U.S.C. 154(b) by 634 days.

(21) Appl. No.: 09/860,704

(22) Filed: May 18, 2001

(65) Prior Publication Data

US 2003/0209751 A1 Nov. 13, 2003

(51) Int. Cl.[7] .............................................. H01L 29/788
(52) U.S. Cl. ..................... 257/319; 257/314; 257/315; 257/316
(58) Field of Search ................................. 257/314, 315, 257/316, 317, 318, 319, 320, 321, 322, 323, 329, 375, 324

(56) References Cited

U.S. PATENT DOCUMENTS

| | | | |
|---|---|---|---|
| 4,811,067 A | 3/1989 | Fitzgerald et al. | |
| 4,835,741 A | 5/1989 | Baglee | |
| 4,890,145 A | 12/1989 | Malhi | |
| 4,975,384 A | 12/1990 | Baglee | |
| 4,990,979 A | 2/1991 | Otto | |
| 5,070,032 A | 12/1991 | Yuan et al. | |
| 5,095,344 A | 3/1992 | Harari | |
| 5,172,338 A | 12/1992 | Mehrotra et al. | |
| 5,313,421 A | 5/1994 | Guterman et al. | |
| 5,315,142 A | 5/1994 | Acovic et al. | |

(Continued)

FOREIGN PATENT DOCUMENTS

| | | |
|---|---|---|
| EP | 0 601 747 A2 | 11/1993 |
| JP | 03-042873 | 2/1995 |
| JP | 10-41414 | * 2/1998 |
| JP | 10041414 | 2/1998 |
| TW | 252221 | 7/1995 |
| WO | WO 97/32309 | 9/1997 |

OTHER PUBLICATIONS

Ogura et al. "Low Voltage, Low Current, High Speed Program step split gate Cell with Ballistic Direct Injection for EEPROM/Flash," *IEEE Publication*, Sep. 1998, pp. 36.5.1–36.5.4.

(Continued)

Primary Examiner—Nathan J. Flynn
Assistant Examiner—Kevin Quinto
(74) Attorney, Agent, or Firm—Parsons Hsue & de Runtz LLP

(57) ABSTRACT

Several embodiments of flash EEPROM split-channel cell arrays are described that position the channels of cell select transistors along sidewalls of trenches in the substrate, thereby reducing the cell area. Select transistor gates are formed as part of the word lines and extend downward into the trenches with capacitive coupling between the trench sidewall channel portion and the select gate. In one embodiment, trenches are formed between every other floating gate along a row, the two trench sidewalls providing the select transistor channels for adjacent cells, and a common source/drain diffusion being positioned at the bottom of the trench. A third gate provides either erase or steering capabilities. In another embodiment, trenches are formed between every floating gate along a row, a source/drain diffusion extending along the bottom of the trench and upwards along one side with the opposite side of the trench being the select transistor channel for a cell. Techniques for manufacturing such flash EEPROM split-channel cell arrays are also described.

18 Claims, 9 Drawing Sheets

U.S. PATENT DOCUMENTS

| | | |
|---|---|---|
| 5,315,541 A | 5/1994 | Harari et al. |
| 5,343,063 A | 8/1994 | Yuan et al. |
| 5,411,905 A | 5/1995 | Acovic et al. |
| 5,486,714 A | 1/1996 | Hong |
| 5,495,441 A | 2/1996 | Hong |
| 5,498,564 A | 3/1996 | Geissler et al. |
| 5,576,567 A | 11/1996 | Mori |
| 5,579,259 A | 11/1996 | Samachisa et al. |
| 5,606,521 A | 2/1997 | Kuo et al. |
| 5,616,510 A | 4/1997 | Wong |
| 5,643,814 A | 7/1997 | Chung |
| 5,661,053 A | 8/1997 | Yuan |
| 5,712,180 A | 1/1998 | Guterman et al. |
| 5,786,612 A | 7/1998 | Otani et al. |
| 5,891,774 A | 4/1999 | Ueda et al. |
| 5,949,101 A | 9/1999 | Aritome |
| 6,037,221 A | 3/2000 | Lee et al. |
| 6,103,573 A | 8/2000 | Harari et al. |
| 6,151,248 A | 11/2000 | Harari et al. |
| 6,222,762 B1 | 4/2001 | Guterman et al. |
| 6,281,075 B1 | 8/2001 | Yuan et al. |
| 6,316,315 B1 | 11/2001 | Hofmann et al. |
| 6,391,716 B1 * | 5/2002 | Liou |
| 6,512,263 B1 | 1/2003 | Yuan et al. |
| 6,532,172 B2 | 3/2003 | Harari et al. |
| 2002/0118574 A1 | 8/2002 | Gongwer et al. |

OTHER PUBLICATIONS

Di–Son Kuo et al., "TEFET—A High Density, Low Erase Voltage, Trench Flash EEPROM," *IEEE Publication*, Apr. 1994, pp. 51–52.

Pein et al., "Performance of the 3–D Sidewall Flash EPROM Cell,"*Symposium on VLSI Technology Digest of Technical Papers(IEEE)*, Nov. 1993, pp. 2.1.1–2.1.4.

Notification of Transmittal of the International Search Report mailed Jan. 29, 2003.

* cited by examiner

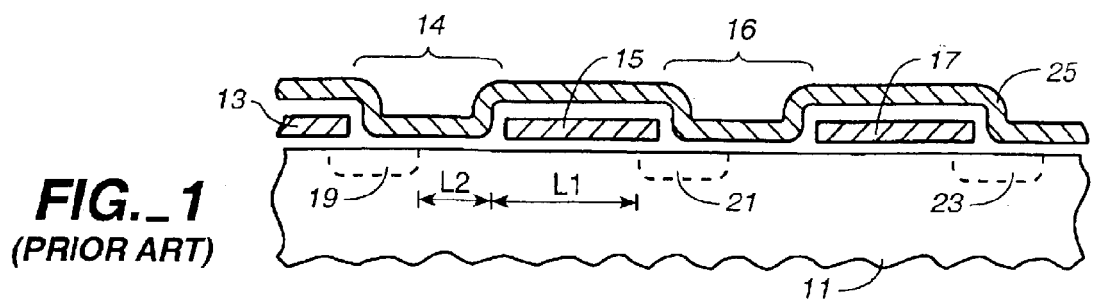
FIG._1 (PRIOR ART)
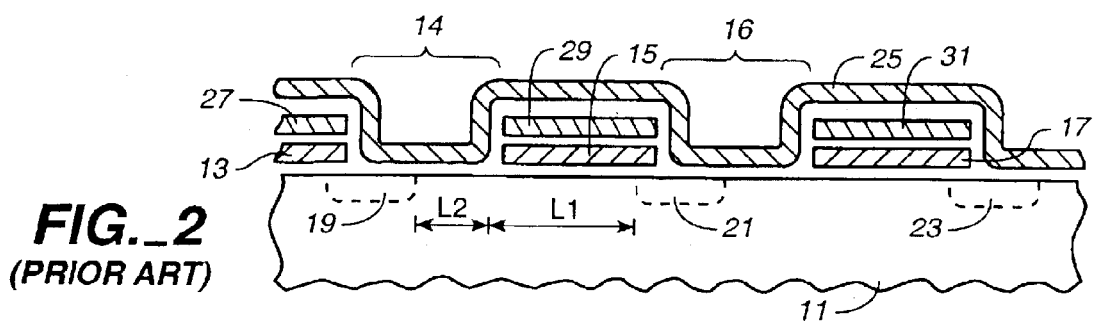
FIG._2 (PRIOR ART)
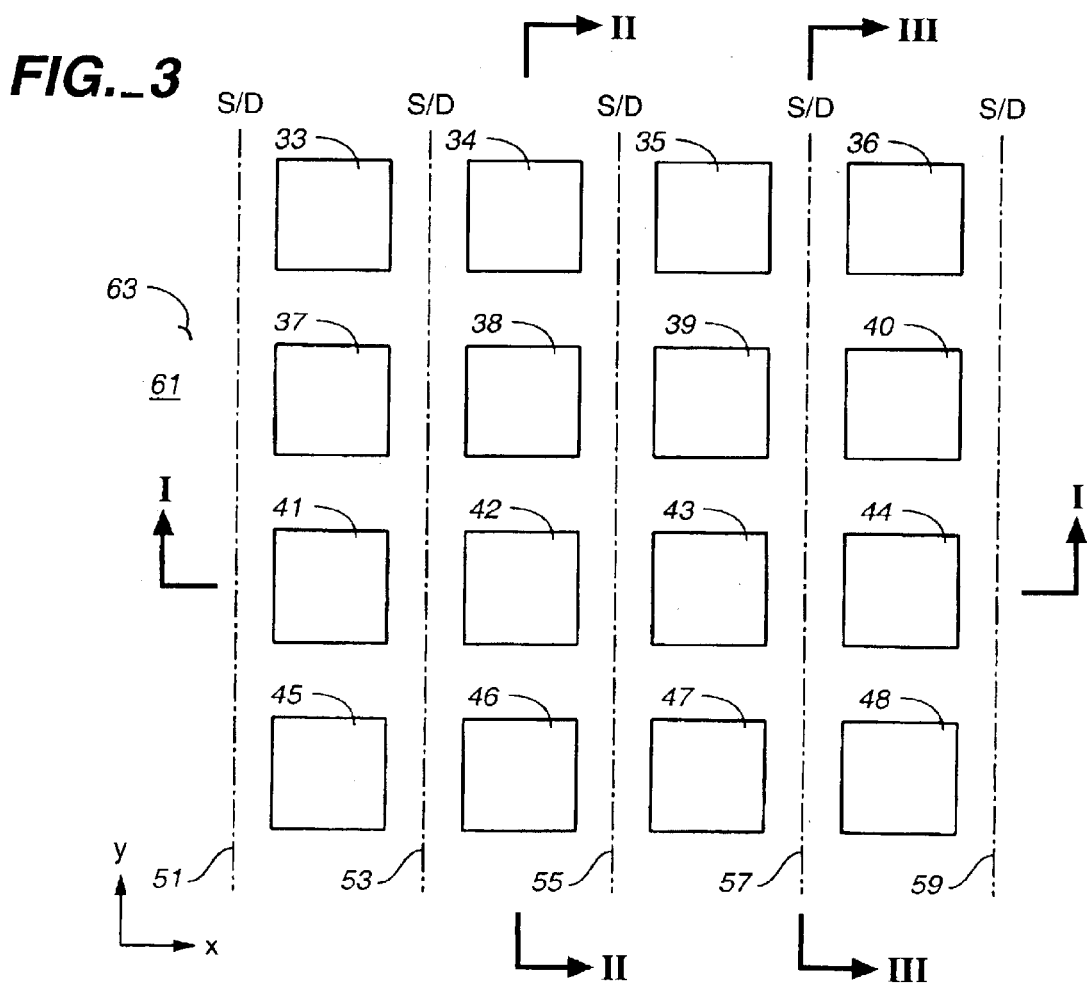
FIG._3

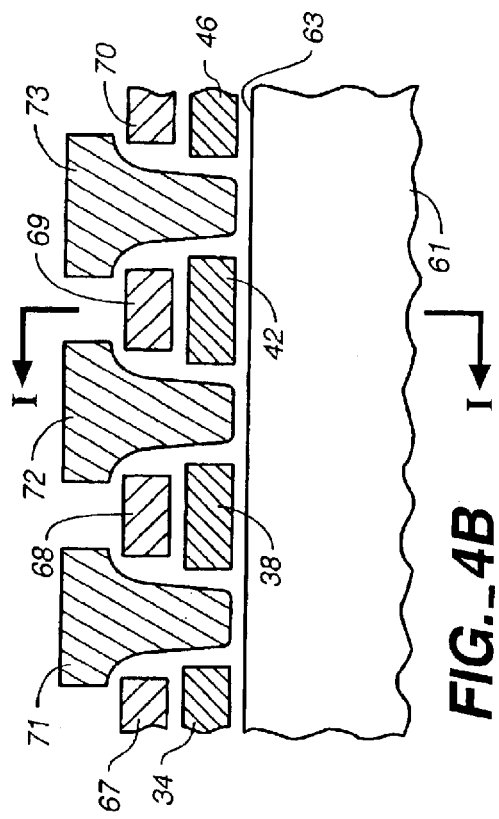
FIG._4A
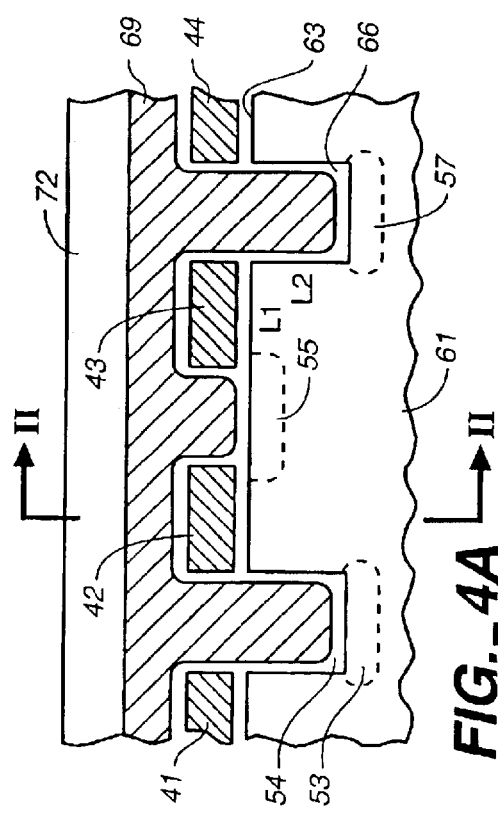
FIG._4B
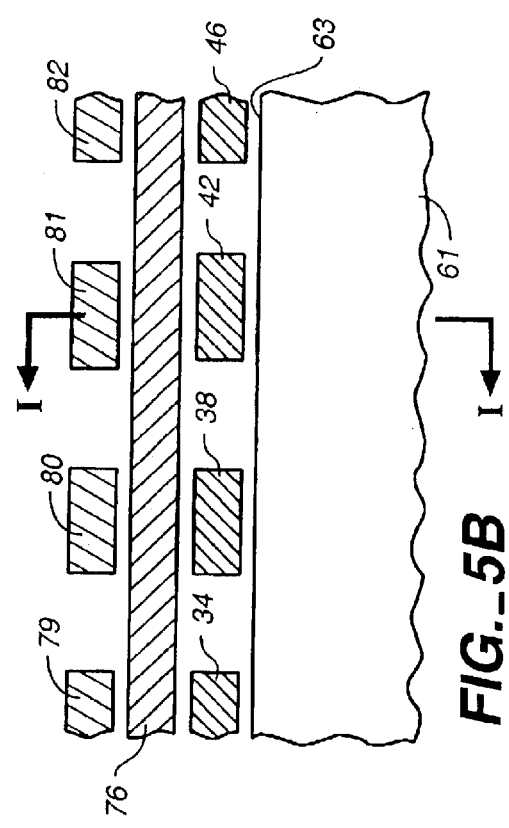
FIG._5A
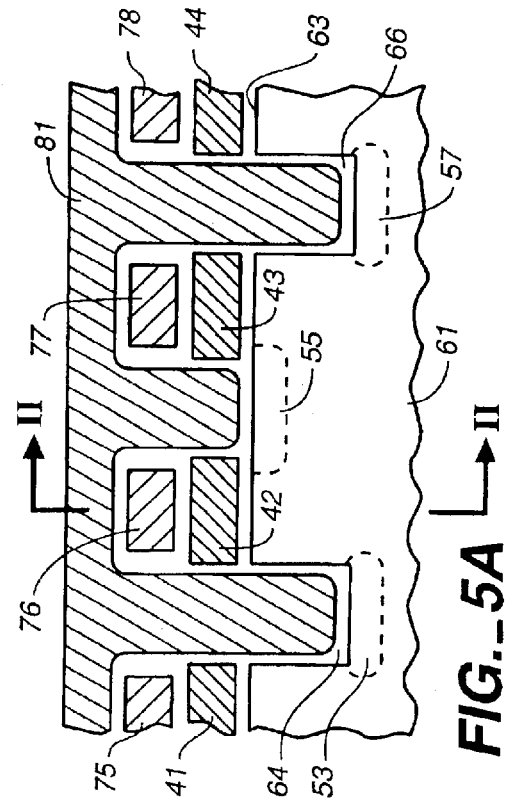
FIG._5B

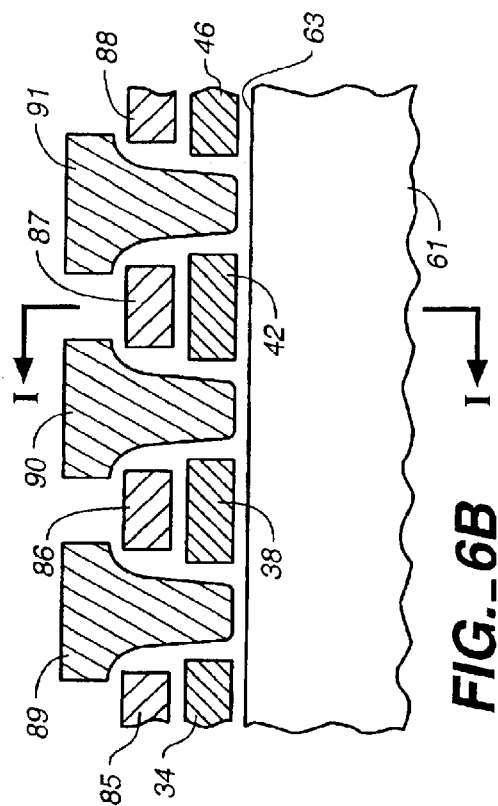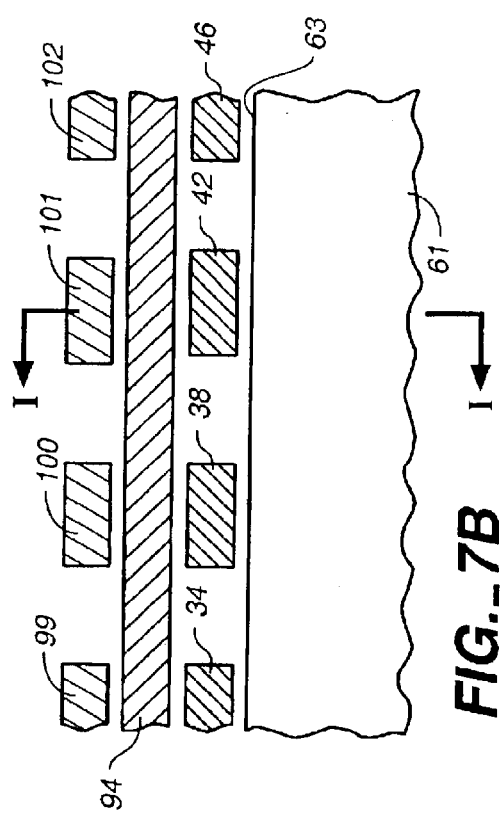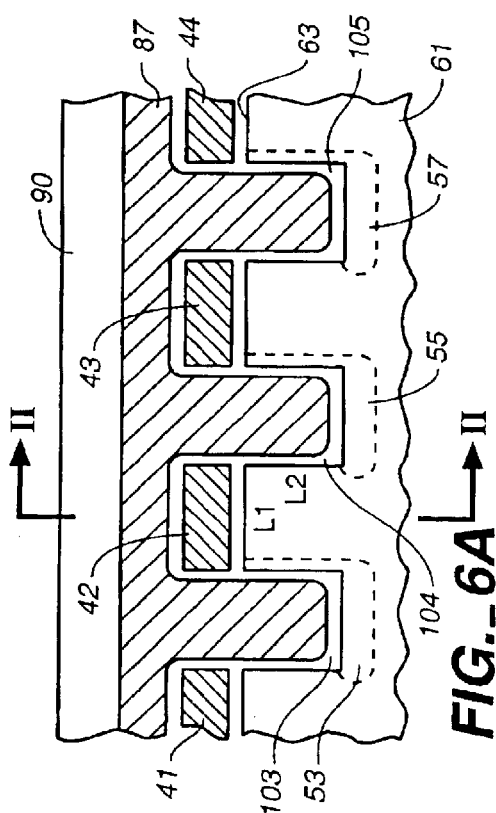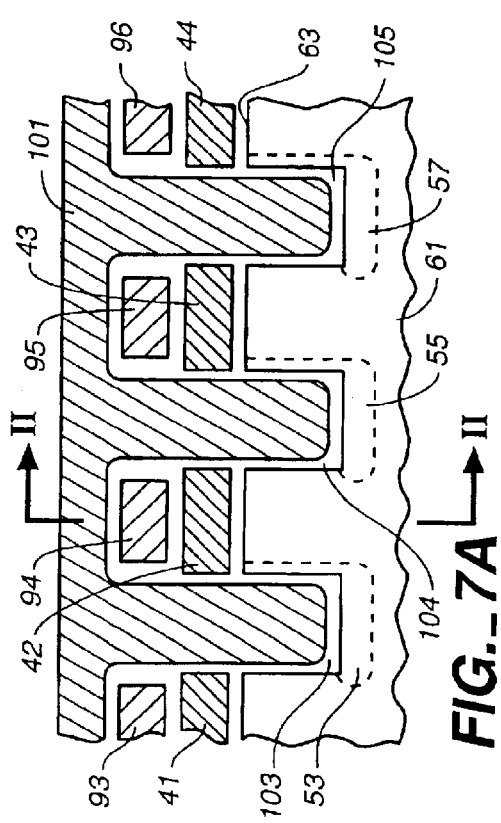

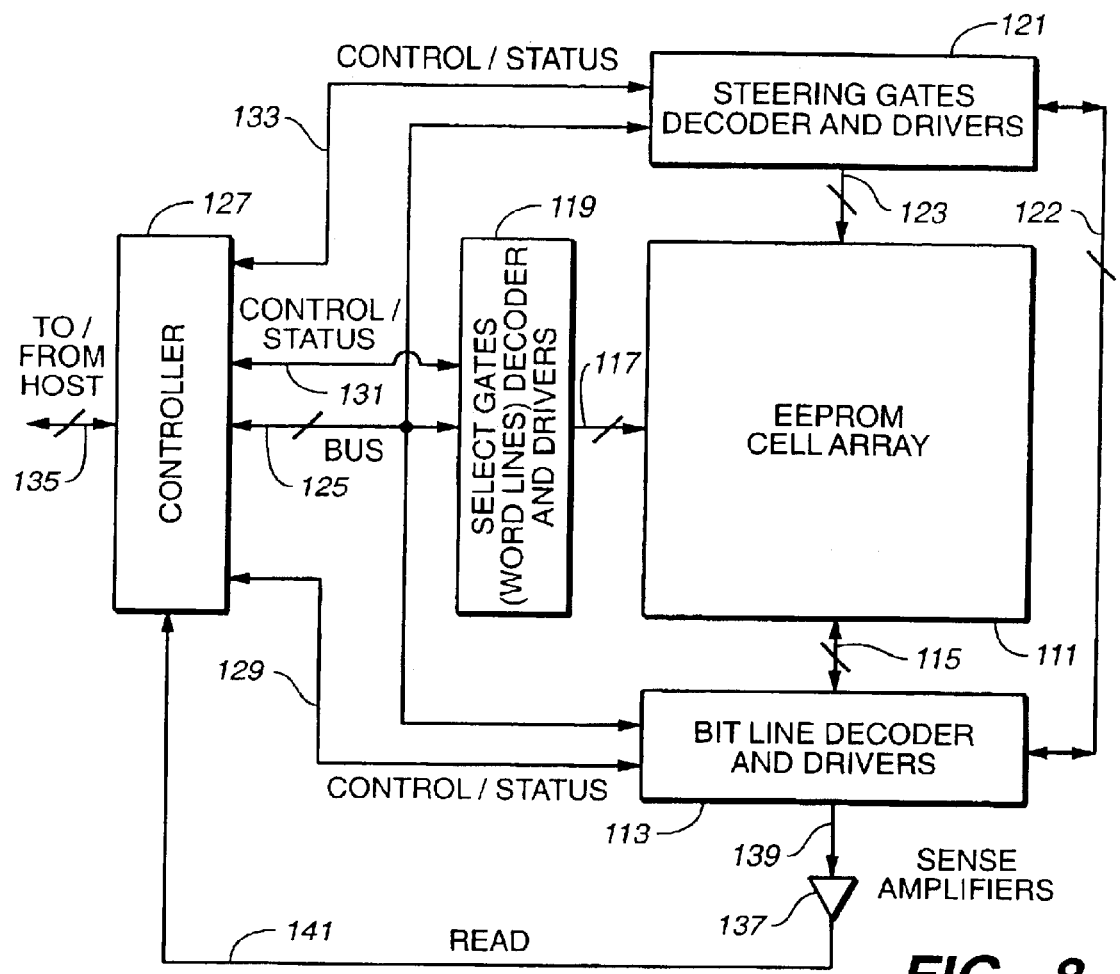
FIG._8

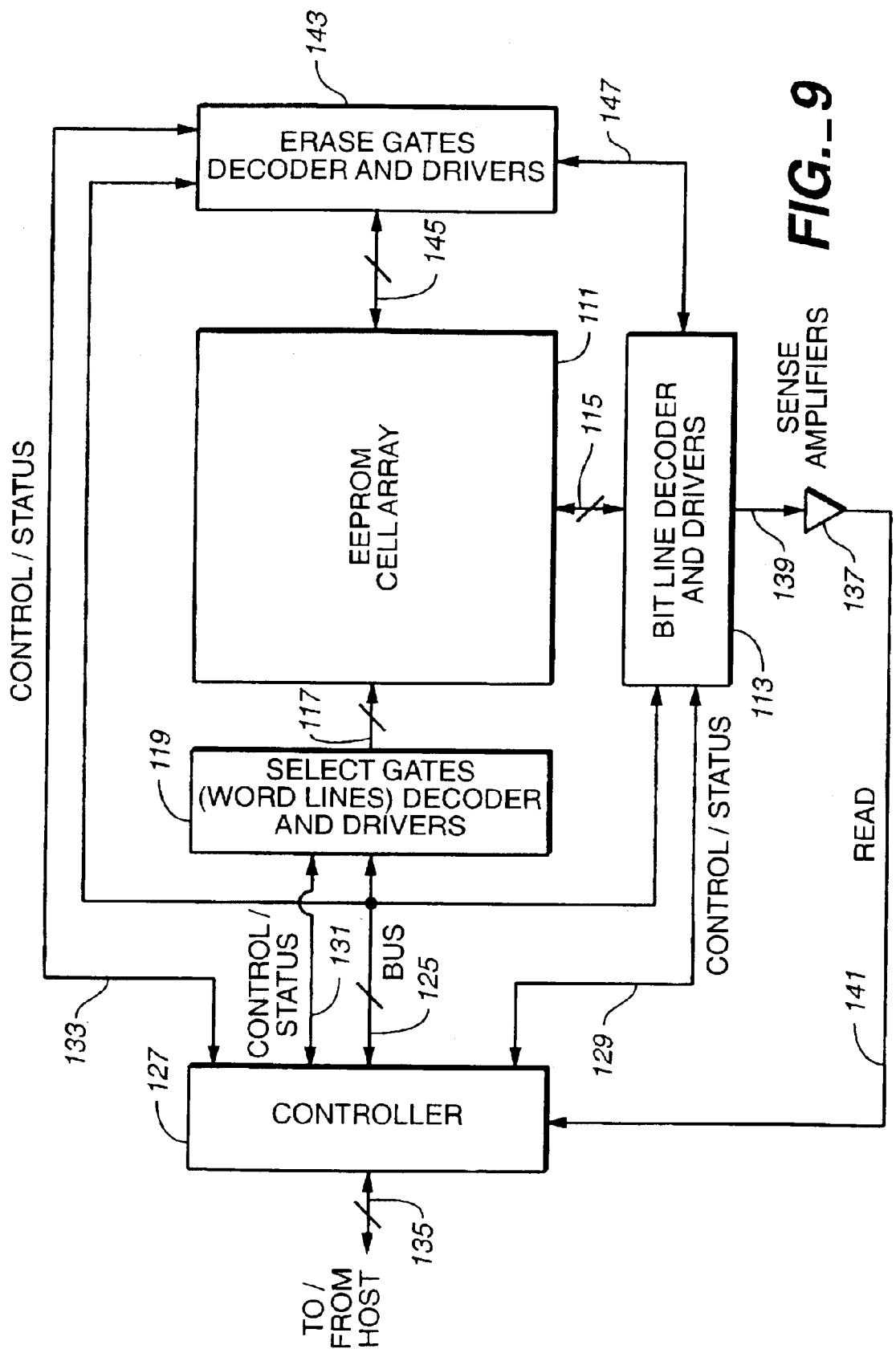
FIG._9

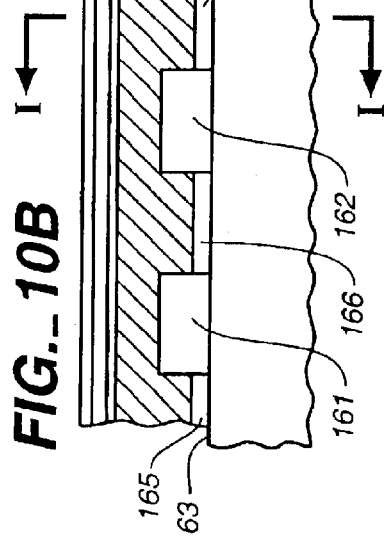
FIG._10A
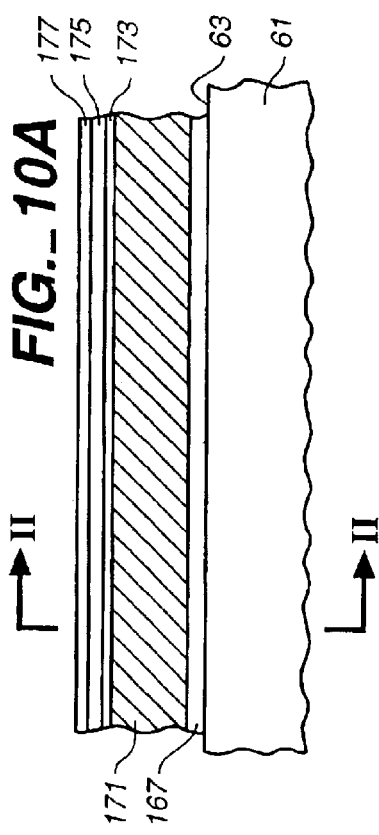
FIG._10B
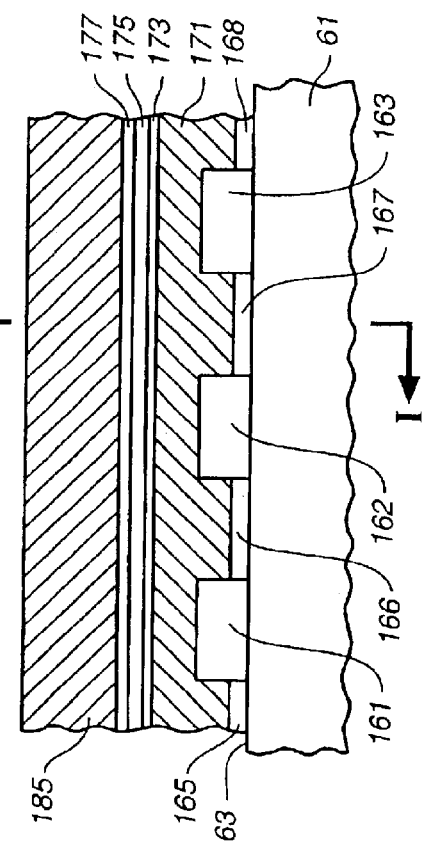
FIG._11A
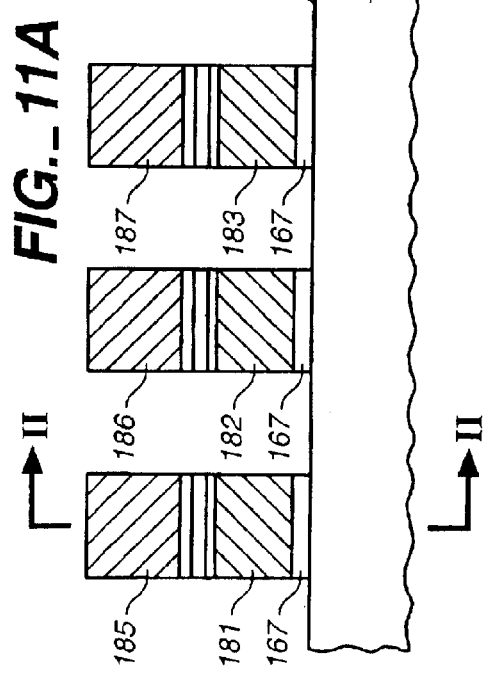
FIG._11B

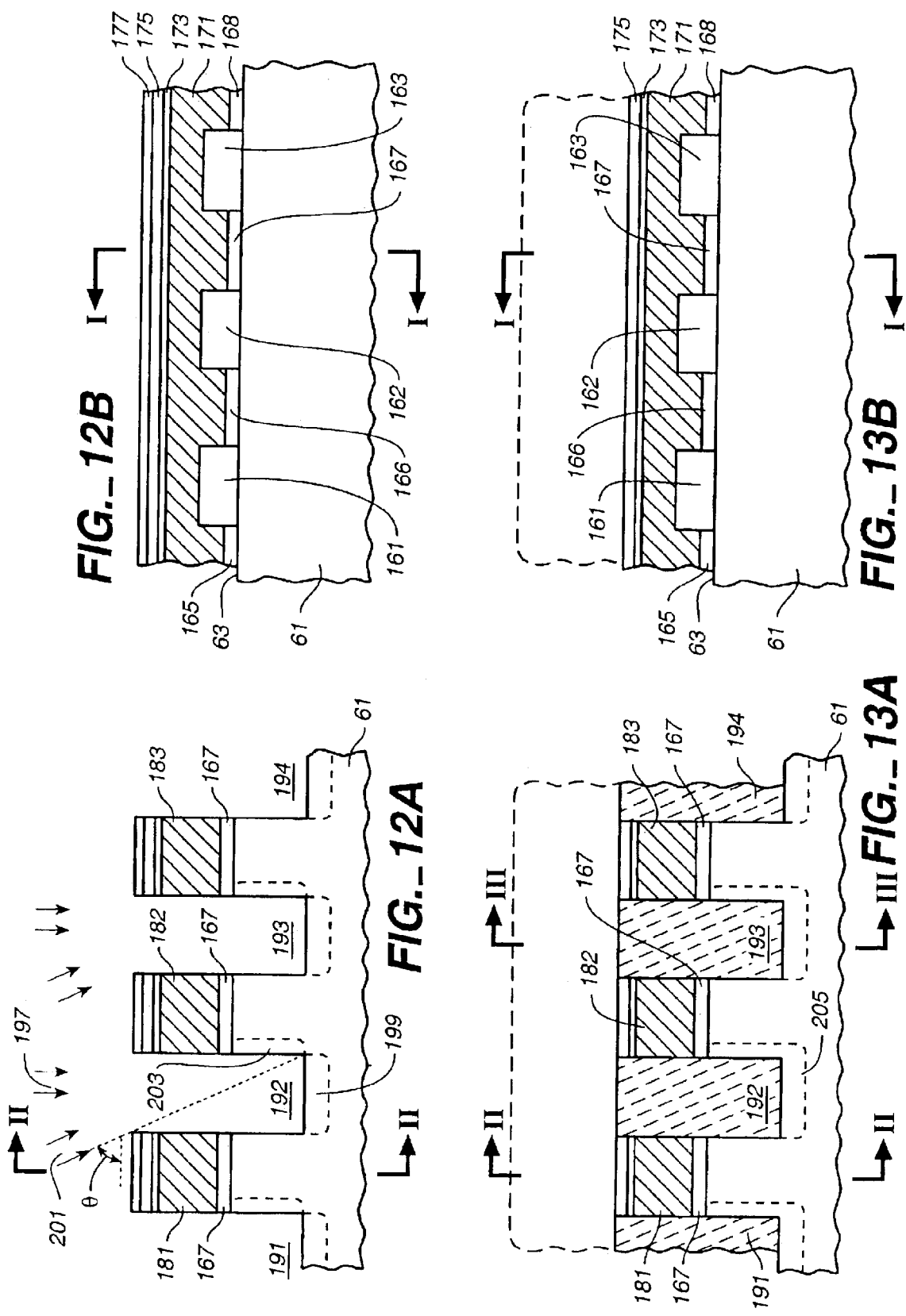

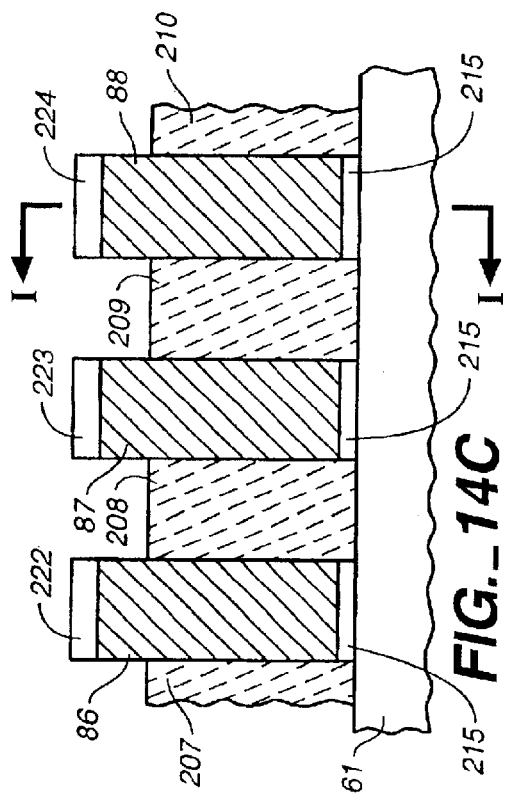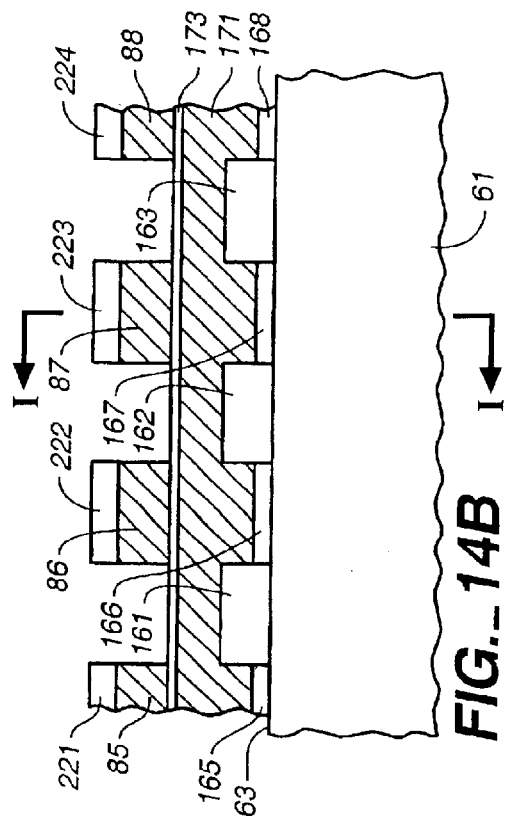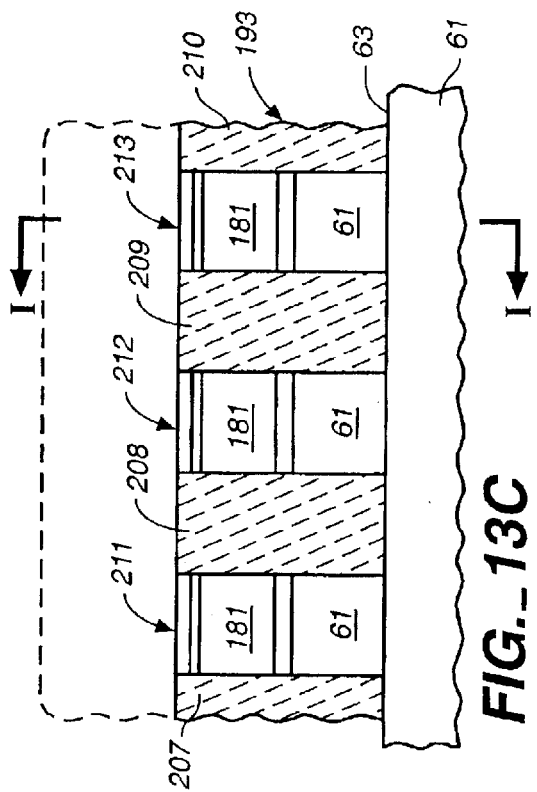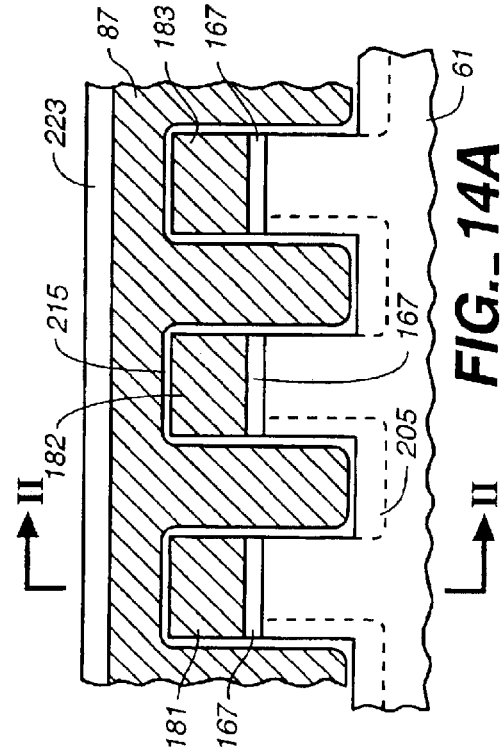

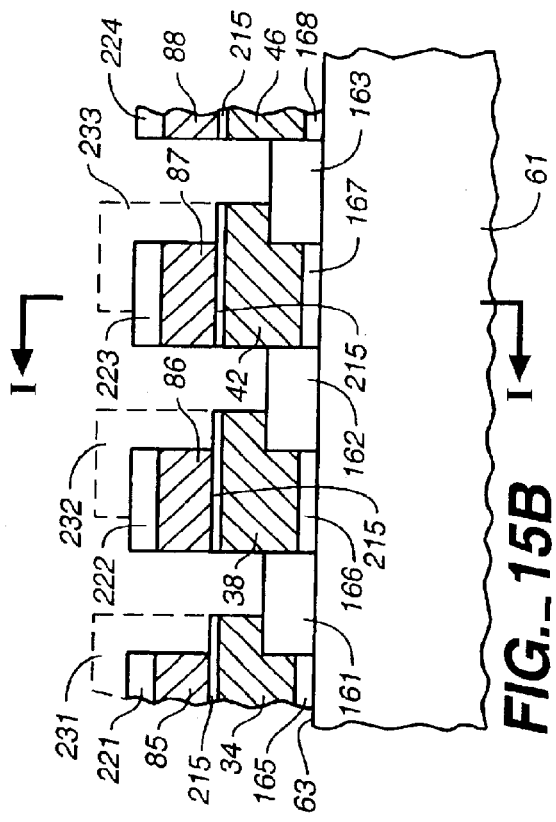
*FIG._15B*
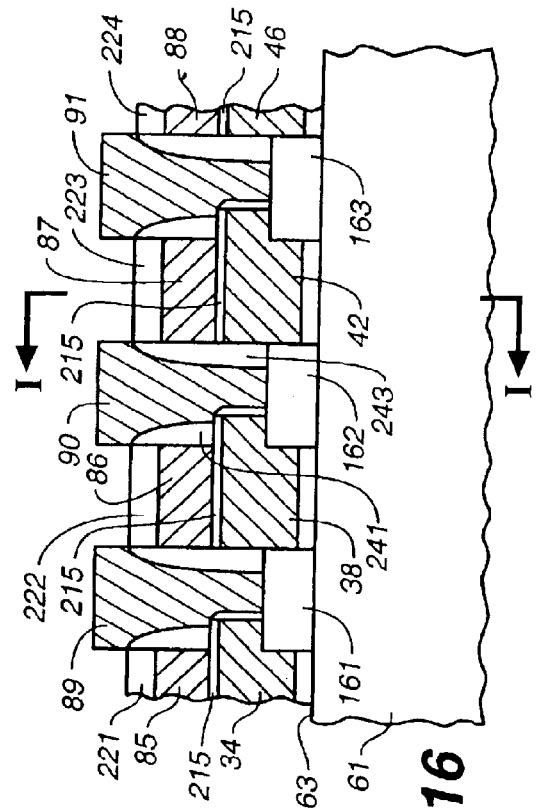
*FIG._16*
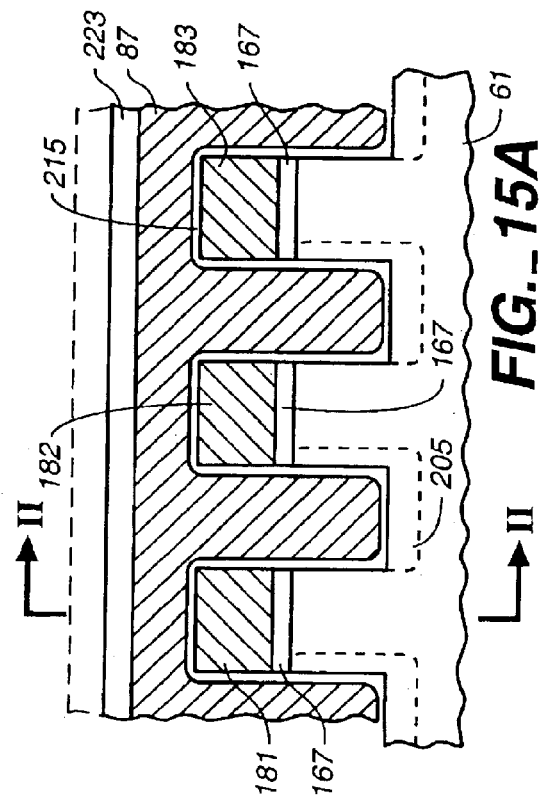
*FIG._15A*

FLOATING GATE MEMORY CELLS UTILIZING SUBSTRATE TRENCHES TO SCALE DOWN THEIR SIZE

BACKGROUND OF THE INVENTION

This invention relates to non-volatile flash EEPROM (Electrically Erasable and Programmable Read Only Memory) cell arrays, primarily to the structure of memory cells and to processes of manufacturing memory arrays of them.

There are many commercially successful non-volatile memory products being used today, particularly in the form of small cards, which use a flash EEPROM array of cells having a "split-channel" between source and drain diffusions. The floating gate of the cell is positioned over one portion of the channel and the word line (also referred to as a control gate) is positioned over the other channel portion as well as the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, and 5,661,053, and in U.S. patent application Ser. No. 09/239,073, filed Jan. 27, 1999, now U.S. Pat. No. 6,281,075, which patents are incorporated herein by this reference.

A modification of this split-channel flash EEPROM cell adds a steering gate positioned between the floating gate and the word line. Each steering gate of an array extends over one column of floating gates, perpendicular to the word line. The effect is relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). Further, such cells may operate with source side programming, having an advantage of lower programming voltages. The use of steering gates in a flash EEPROM array is described in U.S. Pat. Nos. 5,313,421, 5,712,180, and 6,222,762, which patents are incorporated herein by this reference.

Two techniques of removing charge from floating gates to erase memory cells are used in both of the two types of memory cell arrays described above. One is to erase to the substrate by applying appropriate voltages to the source, drain, substrate and other gate(s) that cause electrons to tunnel through a portion of a dielectric layer between the floating gate and the substrate. The other erase technique transfers electrons from the floating gate to another gate through a tunnel dielectric layer positioned between them. In the first type of cell described above, a third erase gate is provided for that purpose. In the second type of cell described above, which already has three gates because of the use of a steering gate, the floating gate is erased to the word line, without the necessity to add a fourth gate. Although this later technique adds back a second function to be performed by the word line, these functions are performed at different times, thus avoiding the necessity of making a compromise to accommodate the two functions.

It is continuously desired increase the amount of digital data that can be stored in a given area of a silicon substrate, in order to increase the storage capacity of a given size memory card and other types packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores four bits of data per cell, and so on. A multiple state flash EEPROM structure and operation is described in U.S. Pat. Nos. 5,043,940 and 5,172,338, which patents are incorporated herein by this reference.

Increased data density can also be achieved by reducing the physical size of the memory cells and/or of the overall array. Shrinking the size of integrated circuits is commonly performed for all types of circuits as processing techniques improve over time to permit implementing smaller feature sizes. But since there are limits of how far a given circuit layout can be shrunk by scaling through simple demagnification, efforts are also directed toward redesigning a feature to take up less area. Therefore, it is a primary object of the present invention to provide floating gate memory cell structures that permit increased data storage density by occupying less area as a result of at least one cell feature being redesigned.

It is a further object of the present invention to provide improved processing techniques for forming a flash EEPROM system utilizing such cells.

SUMMARY OF THE INVENTION

These and additional objects are accomplished by the present invention, wherein, briefly and generally, the select transistor of individual split channel flash EEPROM cells is oriented vertically, along a sidewall of a trench, such as in a trench formed in the substrate, that provides the select transistor channel portion. This significantly reduces the dimension in one direction across each individual memory cell. The floating gates are oriented horizontally, preferably above a top surface of the substrate, with at least one edge of individual floating gates being positioned immediately adjacent one such trench. Select gates of the cells are positioned within the adjacent trench along the sidewall channel portion. The cells are optionally but preferably provided with a third gate element that serves either as an erase gate or a steering gate, depending upon how it is oriented and used.

In a specific form of the invention, individual floating gates span the entire distance between adjacent trenches over a top surface of the substrate, the select transistor channel being on one sidewall of the trenches that face the same direction, and the source/drain diffusions being formed in the bottom of the trench and extending up along a sidewall opposite to that of the select transistor channel. The size of the individual memory cells, and thus of the array, is reduced in one direction while maintaining a similar orientation of the select and floating gate storage transistors of the individual memory cells. Further, the resulting source and drain diffusions have larger cross-sectional areas than usual, thus increasing their conductivity and, as a result, reducing the number of electrical contacts that are necessary along the length of the diffusions.

Additional objects, advantages and features of the various aspects of the present invention are included in the following description of its preferred embodiments, which description should be read in conjunction with the accompanying drawings.

BRIEF DESCRIPTION OF THE DRAWINGS

FIGS. 1 and 2 are cross-sectional views along rows of two types of split-channel cells according to the prior art;

FIG. 3 is a generic plan view of an array of floating gate memory cells in which the improvements of the present invention are explained;

FIGS. 4A and 4B are cross-sectional views of memory cells according to a first specific embodiment of the present invention, taken at sections I—I and II—II, respectively, across the array of FIG. 3;

FIGS. 5A and 5B are cross-sectional views of memory cells according to a second specific embodiment of the present invention, taken at sections I—I and II—II, respectively, across the array of FIG. 3;

FIGS. 6A and 6B are cross-sectional views of memory cells according to a third specific embodiment of the present invention, taken at sections I—I and II—II, respectively, across the array of FIG. 3;

FIGS. 7A and 7B are cross-sectional views of memory cells according to a fourth specific embodiment of the present invention, taken at sections I—I and II—II, respectively, across the array of FIG. 3;

FIG. 8 is a block diagram of a flash EEPROM system that utilizes the memory cells of either of the second or fourth specific embodiments of respective FIGS. 5A, 5B and 7A, 7B;

FIG. 9 is a block diagram of a flash EEPROM system that utilizes the memory cells of either of the first or third specific embodiments of respective FIGS. 4A, 4B and 6A, 6B;

FIGS. 10A and 10B show in cross-section an intermediate structure which occurs during the formation of the third cell array embodiment of FIGS. 6A and 6B, taken at sections I—I and II—II, respectively, of FIG. 3;

FIGS. 11A and 11B show in cross-section another intermediate structure which occurs during the formation of the third cell array embodiment of FIGS. 6A and 6B, taken at sections I—I and II—II, respectively, of FIG. 3;

FIGS. 12A and 12B show in cross-section another intermediate structure which occurs during the formation of the third cell array embodiment of FIGS. 6A and 6B, taken at sections I—I and II—II, respectively, of FIG. 3;

FIGS. 13A, 13B and 13C show in cross-section another intermediate structure which occurs during the formation of the third cell array embodiment of FIGS. 6A and 6B, taken at sections I—I, II—II and III—III, respectively, of FIG. 3;

FIGS. 14A, 14B and 14C show in cross-section another intermediate structure which occurs during the formation of the third cell array embodiment of FIGS. 6A and 6B, taken at sections I—I, II—II and III—III, respectively, of FIG. 3;

FIGS. 15A and 15B show in cross-section another intermediate structure which occurs during the formation of the third cell array embodiment of FIGS. 6A and 6B, taken at sections I—I and II—II, respectively, of FIG. 3; and FIG. 16 shows in cross-section a subsequent structure occurring during the formation of the third cell array embodiment of FIGS. 6A and 6B, taken at section II—II of FIG. 3.

DESCRIPTION OF THE PREFERRED EMBODIMENTS

A typical split channel prior art memory cell and array are illustrated by the sectional view of FIG. 1, wherein a semiconductor substrate 11 has a two dimensional array of rows and columns of floating gates distributed across its surface. Floating gates 13, 15 and 17, adjacent to each other along a row, are shown. Spaces 14 and 16 exist between floating gates. Elongated source and drain diffusions 19, 21 and 23 extend parallel with each other across the substrate in a direction into the paper. A conductive word line 25 extends along and over a row of floating gates. Some memories erase the floating gates to the substrate but others include a third gate (not shown) between rows of floating gates that is capacitively coupled with at least one of the rows for erasing the floating gates by electron tunneling through a dielectric between them. Dielectric layers between the gates, and between the gates and the substrate are not shown in order to reduce the clutter of the drawings but are understood to exist.

The channel of this type of memory cell is split into two segments. One segment L1 is controlled by the voltage of the floating gate 15, which in turn is influenced by the voltage on its word line 25 and another segment L2 is controlled by the voltage of the word line 25 alone. This cell is, in effect, formed of two series connected transistors, the floating gate transistor (L1) and the select transistor (L2). The voltage on the word line 25 affects whether the select transistor of each of the cells through which it passes is turned on or off, and thus whether the floating gate transistors of these cells are connected between the cell's adjacent source and drain diffusions, such as the diffusions 19 and 21 of the cell that is illustrated.

A variation of the cell and array of FIG. 1 is shown in FIG. 2. Steering gates 27, 29 and 31, elongated in a direction into the paper, are added. The steering gates extend along columns of floating gates and are capacitively coupled with them. They separate the word lines from being coupled with the floating gates over which they pass. A voltage on the word lines still controls the select transistors of the cells within their rows by being coupled with the L1 segment of the cells' channels but is no longer used to control the voltage of the floating gates. The steering gates of this type of array do so. Voltages on the steering gates select the floating gates for programming or reading. Programming by source side injection is then possible, which method can use reduced voltages during programming. Erasing of the floating gates of some can be either to the substrate or to the word line.

FIG. 3 shows a few elements of an array of floating gate memory cells in plan view across a surface 63 of a semiconductor substrate 61, as a framework in which to reference the perspectives of the various cross-sectional views that follow. Floating gates 33–48 are arranged in an array of rows (extending in the "x" direction indicated) and columns (extending in the "y" direction indicated) that are perpendicular with each other. The floating gates are rectangular in shape, often square, and are spaced apart from each other in each of the x and y directions. Source and drain diffusions 51, 53, 55, 57 and 59 are elongated in the y direction and spaced apart from each other in the x direction, and are positioned between columns of floating gates. This general outline of memory elements is common to each of the four different structures described in FIGS. 4A–7B.

First Specific Embodiment of the Memory Cells and Array

In the embodiment shown by the orthogonal cross-sectional views of FIGS. 4A and 4B, alternate diffusions are positioned across the substrate in the x-direction in the bottom of trenches in the substrate, and the remaining diffusions are formed on the substrate surface. The trenches are elongated in the y-direction and spaced apart in the x-direction. The diffusions 53 and 57, for example, are in the bottom of respective trenches 64 and 66 in the substrate 61, while the diffusion 55 is formed in the substrate surface 63. Word lines 67–70 are elongated with their lengths extending in the x-direction across the substrate over a row of floating gates, while being spaced apart in the y-direction. The word lines include select gates extending down into the trenches, as shown in FIG. 4A for the word line 69 with select gates in the trenches 64 and 66. A thin dielectric between the walls of a trench and the select gate therein provides capacitive coupling between the select gate and the channel portions in both of the opposite trench walls. The voltage on the word line thus controls the conduction of the trench wall channel portions L2 along the row of cells. The floating gates are formed from a first deposited polysilicon layer, and the word lines from another polysilicon layer that is subsequently deposited.

Each sidewall of the individual trenches is a channel of a select transistor. For the memory cell including the floating gate 43, for example, the L2 portion of the channel is along one sidewall of the trench 66 while the L1 portion of the channel is along the substrate surface 63. An adjacent memory cell including the floating gate 44 utilizes the opposite sidewall of the trench 66 for its select gate channel portion L2 while the channel portion L1 is along the substrate surface. Adjacent memory cells are thus mirror images of one another in the x-direction across the substrate. Since the select transistor channel portions L1 of the cells are formed vertically, the size of the array is reduced in the x-direction across the substrate 61. Yet the floating gates remain across the surface 63 of the substrate 61.

As a preferred mechanism for erasing the floating gates, erase gates 71–73 are formed from a third polysilicon layer with their lengths extending in the x-direction. The erase gates are spaced apart in the y-direction and located between rows of floating gates. Each erase gate is preferably capacitively coupled through tunnel dielectric layers with the floating gates of a row on one side of the erase gate but not with the floating gates of the row on the other side. Alternatively, alternate erase gates in the x-direction across the substrate can be omitted and the remaining erase gates coupled with the rows of floating gates on both sides. The use of erase gates is preferred to omitting them and erasing the floating gates to the substrate 61 because of difficulties in adequately isolating blocks of cells from each other for selective block erasing, particularly since use of trenches according to the present invention requires that isolating diffusion wells for the individual blocks be made to extend deeper into the substrate.

Second Specific Embodiment of the Memory Cells and Array

The orthogonal cross-sectional views of FIGS. 5A and 5B show a second embodiment that has the same structure of floating gates, trenches and diffusions as the first embodiment but the gates formed from the second and third polysilicon layers are different. The second polysilicon layer is formed into select gates 75–78 that are elongated in the y-direction and spaced apart across the substrate 61 in the x-direction. Each select gate extends across a column of floating gates with which it is capacitively coupled, so that a portion of the voltage on a steering gate is coupled with the floating gates under it.

Word lines 79–82 are formed from the third polysilicon layer. As can be seen from FIG. 5A, select transistor gates extend downward from the word line 81 into the trenches 64 and 66. As with the first embodiment, the select gates are capacitively coupled with both sides of the trenches that are opposite to each other in the x-direction. The floating gates are preferably erased to the word lines through a thin tunnel dielectric positioned therebetween. Alternatively, the floating gates of this embodiment may be erased to the substrate if blocks of cells are isolated from each other by distinct diffusion wells in the substrate. If erased to the substrate, the dielectric between the word lines and adjacent floating gates is made thicker to reduce the coupling between them.

Use of the steering gates separates the functions of the control gates of the first embodiment to turn on select transistors and couple a desired voltage to floating gates at the same time. These voltages may then be individually optimized rather than a compromise voltage applied to the control gates. During programming and reading, the select gates of the second embodiment are controlled by a voltage on the word lines while an appropriate voltage is coupled to the floating gates from the steering gates. Another advantage is that lower voltages may be used to program the cells from their source side.

Third Specific Embodiment of the Memory Cells and Array

A cell array using a different trench structure than in the first and second embodiments is illustrated by the orthogonal sectional views of FIGS. 6A and 6B. In this third embodiment, trenches are provided between each column of floating gates. Trenches 103, 104 and 105 of FIG. 6A have widths that extend completely between, or almost completely between, adjacent columns of floating gates that include respective floating gates 41–44. Source and drain diffusions 53, 55 and 57 of this embodiment are formed in the bottom and up one side of respective trenches 103, 104 and 105, the sides all facing in the same direction. The select gate channel L2 of a cell is on a wall of each trench that is opposite to the wall containing the diffusion. The floating gates 41–44 remain on the substrate surface 63 and extend between trenches on either side of them in the x-direction. The sidewall portion of the diffusions extend up to the substrate surface 63 and are individually overlapped on the surface 63 by a floating gate. The source and drain diffusions have an enlarged cross-sectional area that improves their conductivity and thus reduces the number of contacts which may be made along their lengths in the y-direction.

Select gates extending into the trenches are part of the individual word lines 85–88. As can best be seen from FIG. 6A, the word line 87 has select gates extending into each of the trenches 103, 104 and 105. They are capacitively coupled with the one wall of each trench that forms the L2 select transistor channel portion in order to select whether current will flow through their cells' substrate channels or not. In a manner similar to the first embodiment, erase gates 89–91 may be provided between rows and capacitively coupled with the floating gates of at least one of the adjacent rows for erasure but are omitted if the floating gates are erased to the substrate 61.

Fourth Specific Embodiment of the Memory Cells and Array

In the fourth embodiment illustrated by the orthogonally oriented cross-sectional views of FIGS. 7A and 7B, the trench structure, floating gate positions and the source and drain diffusion placement are the same as in the third embodiment described above. Added to this embodiment are steering gates 93–96, elongated in the y-direction and spaced apart in the x-direction, extending over individual columns of floating gates and capacitively coupled therewith, similar to the second embodiment described above. The advantages of using steering gates have already been discussed. Word lines 99–102, elongated in the x-direction and spaced apart in the y-direction, include select gates extending downward into the trenches and capacitively coupled with the trench wall opposite to the wall containing the diffusion, such as those of the word line 101 shown in FIG. 7A. As with the second embodiment, the floating gates are preferably erased to the word lines but they may also be erased to the substrate.

Memory Systems Utilizing the Specific Embodiments of the Memory Cells and Arrays An example memory system incorporating the second and fourth embodiments of FIGS. 5A, 5B and 7A, 7B is generally illustrated in the block diagram of FIG. 8. These are the embodiments that utilize steering gates extending along columns of floating gates. A large number of individually addressable memory cells according to the second and fourth specific embodiments are arranged in a regular array 111 of rows and columns, although other physical arrangements of cells are certainly possible. Bit lines, designated herein to extend along columns of the array 111 of cells, are electrically connected with a bit line decoder and driver circuit 113 through lines 115. Word lines, which are designated in this description to extend along rows of the array 111 of cells, are electrically connected through lines 117 to a word line decoder and driver circuit 119. Steering gates, which extend along columns of memory cells in the array 111, are electrically connected to a steering gate decoder and driver circuit 121 through lines 123. Each of the decoders 113, 119 and 121 receives memory cell addresses over a bus 125 from a memory controller 127. The decoder and driving circuits are also connected to the controller 127 over respective control and status signal lines 129, 131 and 133. Voltages applied to the steering gates and bit lines are coordinated through a bus 122 that interconnects the decoder and driver circuits 113 and 121.

The controller 127 is connectable through lines 135 to a host device (not shown). The host may be a personal computer, notebook computer, digital camera, audio player, various other hand held electronic devices, and the like. The memory system of FIG. 8 will commonly be implemented in a card according to one of several existing physical and electrical standards, such as one from the PCMCIA, the CompactFlash™ Association, the MMC™ Association, and others. When in a card format, the lines 135 terminate in a connector on the card which interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 8 are permanently embedded in the host device.

The decoder and driver circuits 113, 119 and 121 generate appropriate voltages in their respective lines of the array 111, as addressed over the bus 125, according to control signals in respective control and status lines 129, 131 and 133, to execute programming, reading and erasing functions. Any status signals, including voltage levels and other array parameters, are provided by the array 111 to the controller 127 over the same control and status lines 129, 131 and 133. A plurality of sense amplifiers 137 receive current or voltage levels from the circuit 113 over lines 139 that are indicative of the states of addressed memory cells within the array 111, and provides the controller 127 with information about those states over lines 141 during a read operation. A large number of sense amplifiers 137 are usually used in order to be able to read the states of a large number of memory cells in parallel. During reading and program operations, one row of cells is typically addressed at a time through the circuits 119 for accessing a number of cells in the addressed row that are selected by the circuits 113 and 121. During an erase operation, all cells in each of many rows are typically addressed together as a block for simultaneous erasure.

A similar memory system is illustrated in FIG. 9, but for an array of memory cells that have separate erase gates without the use of steering gates. Examples of such arrays are the first and third embodiments described above with respect to FIGS. 4A, 4B and 6A, 6B. Instead of the steering gate decoder and driver circuit 121 of FIG. 8, an erase gate decoder and driver circuit 143 is included. Proper erase voltages are applied through lines 145 to the erase gates of the cells that are selected for simultaneous erase. Voltages applied to the erase gates and bit lines are coordinated through a bus 147 that interconnects the decoder and driver circuits 113 and 143.

Any one of the four cell and array embodiments described above can be modified to erase its floating gates to the substrate rather than to either erase gates (embodiments of FIGS. 4A, 4B and 6A, 6B) or word lines (embodiments of FIGS. 5A, 5B and 7A, 7B). In these cases, the cells are grouped together for simultaneous erasure by isolating the substrate areas in which each group of cells is formed, and then applying a proper voltage to the isolated substrate areas during an erasing operation. In the case of the embodiments of FIGS. 4A, 4B and 6A, 6B, the erase gates are eliminated, thus leaving cells with two polysilicon layers formed into gates rather than three such layers.

Processes of Making the Specific Embodiments of the Memory Cells and Arrays

The cross-sectional views of FIGS. 10–16 illustrate a sequence of steps in a process of forming the third embodiment of the memory cell array described above with respect to FIGS. 6A and 6B. However, many of the steps in this specifically described process are also included in the processes of forming the first, second and fourth embodiments described above, as is apparent from the following description.

FIGS. 10A and 10B show the results of several initial processing steps. Strips 161–163 of field oxide are formed by depositing a layer of oxide about 2000 Angstroms thick across the surface 63 of the substrate 61. A photoresist mask is then used to etch this layer into the strips 161–163, which have lengths extending across the substrate in the x-direction and are spaced apart in the y-direction. Gate oxide layers 165–168 having a thickness of about 150 Angstrom are then grown on the substrate surface 63 between the field oxide strips 161–163. A next step is to deposit a first layer 171 of polysilicon about 2000 Angstroms thick over the field and gate oxide. The floating gates of the array are later formed from this polysilicon layer. Since the underlying surface on which the polysilicon layer is deposited is irregular, the polysilicon is deposited to a depth greater than desired for the floating gates in order to obtain a relatively smooth surface. That surface is then oxidized to a depth of the excess polysilicon material desired to be removed, thereby leaving a the polysilicon layer 171 with the desired thickness and relatively planar top surface.

A next step after the polysilicon planarization is to grow an oxide layer 173 of about 200 Angstroms thick across the top of the polysilicon layer 171. This is followed by depositing a nitride layer 175 of about 1500 Angstroms on the oxide layer 173. Next, a layer 177 of oxide is deposited to a thickness of about 500 Angstroms across the nitride. The result is a three layer dielectric is known as an "ONO" structure. The nitride layer is later used as a stop to end chemical-mechanical-planarization ("CMP") of the surface.

A next step is to deposit over the ONO structure a sacrificial layer of polysilicon having a thickness to be removed in a later step when trenches are etched into the substrate surface 63. As shown in FIGS. 11A and 11B, the two polysilicon layers, intervening ONO dielectric and field oxide strips are etched down to the substrate surface through a mask (not shown) in order to form strips 181–183 of the first polysilicon layer 171 and clean the substrate between those strips. The strips 181–183 have lengths extending in the y-direction across the substrate surface 63 and are spaced apart in the x-direction. The top polysilicon layer is similarly separated into strips 185–187.

The resulting structure shown in FIGS. 11A and 11B is then used as a mask to etch trenches 191–194 in the silicon substrate 61, as shown in FIGS. 12A and 12B. The top polysilicon layer (strips 185–187) is removed simultaneously with the substrate trenches 191–194 being formed, leaving the ONO dielectric structure in place, as shown in FIGS. 12A and 12B. The source and drain implants are next made, preferably in two steps. A first source position 197 directs ions in a path that is perpendicular with the substrate surface 63 to form doped regions in the bottom of the trenches, such as region 199 implanted in the bottom of the trench 192. The ONO and first polysilicon layer strips form an implant mask. A second source position 201 is directed at an angle θ with the substrate surface 63 to form doped regions along one side of each of the trenches, such as the region 203 along one sidewall of the trench 192. The angle θ is chosen to adequately expose the entire trench sidewall, from its bottom to the substrate surface 63. A resulting diffusion of the ions in a subsequent annealing step forms the ions into a continuous region 205 (FIG. 13A) extending from the substrate surface, down one trench sidewall to the trench bottom, and along the bottom of the trench to the opposite sidewall. The opposite sidewall is not implanted since it forms the select transistor portion of the memory cell substrate channel in the completed device.

A next step, as shown in FIGS. 13A, 13B and 13C, is to deposit a very thick layer of oxide, in the neighborhood of 5000 Angstroms, over the entire array. This completely fills in all the trenches and extends above the structure as indicated in dashed outline. The excess oxide is then removed by a CMP process, down to the nitride layer 175, which serves as a stop to the CMP process. A next step is to form a mask (not shown) of elongated strips with lengths extending across the planarized surface in the x-direction with spaces defining oxide in the trenches that is to be removed. The trench oxide is removed where the memory cells are to be formed, namely where the word lines and select gates are later positioned, while leaving the oxide in the trenches between the cells in the y-direction across the substrate. This remaining oxide provides dielectric isolation between rows of cells. This is best shown in FIG. 13C, where segments of oxide 207–210 are shown to alternate along the length of the trench 193 with open positions 211–213 where the oxide has been removed.

With reference to FIGS. 14A, 14B and 14C, a next step is to grow a 70–100 Angstrom layer 215 of oxide over the polysilicon strips 181–183 and the open surfaces of the substrate trenches 191–194. Another polysilicon layer is then deposited over the array to extend into the open regions of the trenches. A layer of about 1500 Angstroms of oxide is then deposited over the polysilicon. This combination is then patterned to remove strips of polysilicon and overlying oxide between rows of memory cells, leaving the elongated word lines 85–88 having lengths extending in the x-direction and being spaced apart in the y-direction across the substrate surface 63. Strips 221–224 of oxide then remain on the respective word lines 85–88.

The first polysilicon strips are then separated into individual floating gates, as illustrated by FIGS. 15A and 15B. To do so, a photoresist mask of strips 231–233 elongated in the x-direction is formed. These strips are positioned in the y-direction so each one extends over one edge of a respective word line in order to form a narrow mask opening between it and an opposite edge of an adjacent word line. The first polysilicon strips are then etched through those mask openings, to form, for example, the floating gates 34, 38, 42 and 46 from the polysilicon strip 171, as shown in FIG. 15B.

A next series of steps removes the photoresist mask and forms dielectric spacers along exposed polysilicon walls, as illustrated in FIG. 16. A thick layer of oxide is deposited over the structure shown in FIGS. 15A and 15B, after the photoresist mask strips 231–233 have been removed, and the oxide is removed by an anisotropic etch that leaves sidewall spacers along the vertical walls, such as spacers 241 and 243 of FIG. 16. This leaves edges of the floating gates exposed. A layer about 100 Angstroms thick is grown on these edges, a layer 245 of FIG. 16 being one of them. Another layer of polysilicon is then deposited over the array and patterned to leave the erase gates 89–91. The thin oxide layer 245 allows the floating gate 38 to be erased to the erase gate 90, while the spacers 241 and 243 separate the erase gate 90 from adjacent control gates 86 and 87, and from the floating gate 42, so as to not be capacitively coupled with any of them.

Certain of the foregoing processing details to make the cell array of the third embodiment of FIGS. 6A and 6B are modified to make the cell array of the fourth embodiment of FIGS. 7A and 7B. A primary difference is to form the steering gates 93–96 before the word lines 99–102 are formed, and the erase gates 89–91 are, of course, omitted.

Processes to make the first and second embodiments of FIGS. 4A–5B are different from processes to make the third and fourth embodiments of FIGS. 6A–7B primarily in that a trench is made in the substrate in only every other space between floating gates. Therefore, before the substrate etching step, a mask is formed that temporarily covers alternate spaces between strips of the first polysilicon layer. Further, the angled ion implantation 201 (FIG. 12A) is omitted since it is not desired to provide diffusions along the trench sidewalls in these embodiments.

Although the various aspects of the present invention have been described with respect to specific examples thereof, it will be understood that the invention is entitled to protection within the full scope of the appended claims.

It is claimed:

1. In an array of non-volatile memory cells formed in rows and columns on a semiconductor substrate with elongated source and drain diffusions extending between columns of cells and word lines extending across rows of cells, wherein individual cells have a first channel segment between adjacent source and drain diffusions in the substrate that is controlled by a floating gate and a second channel segment that is controlled by a select gate portion of one of the word lines, an improved structure comprising:

trenches provided in the semiconductor substrate as part of the cells, said second channel segment of the individual cells being provided along a sidewall of one of the trenches and the select sate being positioned in the trench, and elongated third gates extending across the array along and capacitively coupled with floating gates, wherein the elongated third gates are erase gates that have lengths extending in a direction along rows of floating gates and which are individually positioned between adjacent rows of floating gates in a manner to have capacitive coupling with edges of the floating gates of at least one of said adjacent rows.

2. In an array of non-volatile memory cells formed in rows and columns on a semiconductor substrate with elongated source and drain diffusions extending between columns of cells and word lines extending across rows of cells, wherein individual cells have a first channel segment between adjacent source and drain diffusions in the substrate that is controlled by a floating gate and a second channel segment that is controlled by a select gate portion of one of the word lines, an improved structure comprising:

trenches provided in the semiconductor substrate as part of the cells, said second channel segment of the individual cells being provided along a sidewall of one of the trenches and the select gate being positioned in the trench, and elongated third gates extending across the array along and capacitively coupled with floating gates, wherein the elongated third gates are steering gates that have lengths extending across columns of floating gates and are individually positioned to have capacitive coupling with top surfaces of the floating gates of at least one column and underlie said word lines.

3. The memory structure of either claims 1 and 2, wherein one of the trenches is positioned between each of adjacent columns of floating gates, and the source and drain diffusions are positioned at the bottom of the trenches and extend upwards along a sidewall of the trenches opposite to the second channel portion.

4. The memory structure of either one of claim 1 and 2, wherein one of the trenches is positioned between every other column of floating gates across the array, and the source and drain diffusions are positioned between the columns of floating gates at the bottom of the trenches and along the surface of the substrate.

5. In an array of non-volatile memory cells formed in rows and columns on a semiconductor substrate with elongated source and drain diffusions extending between columns of cells and word lines extending across rows of cells, wherein individual cells have a first channel segment between adjacent source and drain diffusions in the substrate that is controlled by a floating gate and a second channel segment that is controlled by a select gate portion of one of the word lines, an improved structure comprising:

trenches provided in the semiconductor substrate as cart of the cells, said second channel segment of the individual cells being provided along a sidewall of one of the trenches and the select gate being positioned in the trench, and elongated third gates extending across the array along and capacitively coupled with floating gates, wherein one of the trenches is positioned between each of adjacent columns of floating gates, and the source and drain diffusions are positioned at the bottom of the trenches and extend upwards along a sidewall of the trenches opposite to the second channel portion.

6. In an array of non-volatile memory cells formed in rows and columns on a semiconductor substrate with elongated source and drain diffusions extending between columns of cells and word lines extending across rows of cells, wherein individual cells have a first channel segment between adjacent source and drain diffusions in the substrate that is controlled by a floating gate and a second channel segment that is controlled by a select gate portion of one of the word lines, an improved structure comprising:

trenches provided in the semiconductor substrate as part of the cells, said second channel segment of the individual cells being provided along a sidewall of one of the trenches and the select gate being positioned in the trench, and elongated third gates extending across the array along and capacitively coupled with floating gates, wherein one of the trenches is positioned between every other column of floating gates across the array, and the source and drain diffusions are positioned between the columns of floating gates at the bottom of the trenches and along the surface of the substrate.

7. An array of non-volatile memory cells on a semiconductor substrate, comprising:

elongated source and drain diffusions having their lengths extending in a first direction and being spaced apart in a second direction, the first and second directions being orthogonal to each other, an array of floating gates arranged in columns extending in the first direction and rows extending in the second direction, individual memory cells having one edge of their floating gates positioned over one of the diffusions, trenches in the substrate adjacent opposite edges of the floating gates in the second direction, said trenches containing another one of the diffusions, elongated control gates having lengths extending in the second direction along rows of floating gates and being capacitively coupled with the sidewalls of the trenches that are positioned immediately adjacent the floating gates, and elongated erase gates having lengths extending in the second direction across the array along and capacitively coupled with rows of floating gates.

8. The memory cell of claim 7, wherein the source and drain diffusions are formed in the bottoms of the trenches and on a surface of the semiconductor substrate.

9. The memory cell array of claim 7, wherein the source and drain diffusions are formed in a bottom and one side of the trenches.

10. An array of non-volatile memory cells on a semiconductor substrate, comprising:

elongated source and drain diffusions having their lengths extending in a first direction and being spaced apart in a second direction, the first and second directions being orthogonal to each other, an array of floating gates arranged in columns extending in the first direction and rows extending in the second direction, individual memory cells having one edge of their floating gates positioned over one of the diffusions, trenches in the substrate adjacent opposite edges of the floating gates in the second direction, said trenches containing another one of the diffusions, elongated word lines having lengths extending in the second direction over rows of floating gates and having select gates capacitively coupled with the sidewalls of the trenches that are positioned immediately adjacent the floating gates, and elongated steering gates having lengths extending in the first direction across the array over and capacitively coupled with columns of floating gates.

11. The memory cell array of claim 10, wherein the source and drain diffusions are formed in the bottoms of the trenches and on a surface of the semiconductor substrate.

12. The memory cell array of claim 10, wherein the source and drain diffusions are formed in a bottom and one side of the trenches.

13. An array of non-volatile memory cells on a semiconductor substrate, comprising:

elongated trenches formed in the substrate with their lengths extending in a first direction and being spaced apart in a second direction, the first and second directions being orthogonal to each other, elongated source and drain diffusions with their lengths extending in the first direction and being spaced apart in the second direction such that first alternate diffusions are formed in the substrate along a bottom of individual trenches and that second alternate diffusions are formed in the substrate along a top surface thereof, an array of floating gates spaced apart across the top surface of the substrate in the first direction and individually spanning between a trench and substrate surface diffusion in the second direction without extending downward into a trench, elongated word lines having lengths extending in the second direction over floating gates and being spaced apart in the first direction, said word lines having select gates extending downward into the trenches to capacitively couple with opposing sidewalls of the trenches, and elongated third gates extending across the array and individually being capacitive coupled with a plurality of floating gates.

14. The memory cell array of claim 13, wherein the elongated third gates are erase gates having lengths extending in the second direction and which are spaced apart in the first direction, said third gates having capacitive coupling with edges of adjacent floating gates.

15. The memory cell array of claim 13, wherein the elongated third gates are steering gates that have lengths extending in the first direction and which are spaced apart in the second direction, said third gates having capacitive coupling with top surfaces of floating gates over which they pass.

16. An array of non-volatile memory cells on a semiconductor substrate, comprising:

elongated trenches formed in the substrate with their lengths extending in a first direction and being spaced apart in a second direction, the first and second directions being orthogonal to each other, elongated source and drain diffusions with their lengths extending in the first direction being formed in the substrate along a bottom and extending upward along one sidewall of the individual trenches to a top surface of the substrate but being absent from an opposite sidewall of the individual trenches, said one sidewall of the trenches facing the same direction, an array of floating gates spaced apart across the top surface of the substrate in the first direction and spanning between the trenches in the second direction without extending downward into the trenches, and elongated word lines having lengths extending in the second direction over floating gates and being spaced apart in the first direction, said word lines having select gates extending downward into the trenches to capacitively couple with said opposite trench sidewalls.

17. The memory cell array of claim 16, which additionally comprises elongated steering gates having lengths extending in the first direction and being spaced apart in the second direction, said steering gates extending under the word lines and over floating gates with capacitive coupling between the steering gates and the floating gates.

18. The memory cell array of claim 16, which additionally comprises elongated control gates having lengths extending in the second direction and being spaced apart in the first direction, said control gates being capacitively coupled with edges of floating gates along which the individual control gates are positioned.

* * * * *